United States Patent
Wen et al.

(10) Patent No.: US 9,664,749 B2
(45) Date of Patent: *May 30, 2017

(54) RESONANT MAGNETIC FIELD SENSOR

(71) Applicant: SAGATEK CO., LTD., Taipei (TW)

(72) Inventors: Kuei-Ann Wen, Hsinchu (TW);
Chia-Feng Chang, New Taipei (TW)

(73) Assignee: SAGATEK CO., LTD., Taipei (TW)

( * ) Notice: Subject to any disclaimer, the term of this patent is extended or adjusted under 35 U.S.C. 154(b) by 180 days.

This patent is subject to a terminal disclaimer.

(21) Appl. No.: 14/662,786

(22) Filed: Mar. 19, 2015

(65) Prior Publication Data
US 2016/0084921 A1 Mar. 24, 2016

(30) Foreign Application Priority Data
Sep. 18, 2014 (TW) .............................. 103132218 A

(51) Int. Cl.
*G01R 33/02* (2006.01)
*G01R 33/028* (2006.01)
*G01R 33/038* (2006.01)

(52) U.S. Cl.
CPC ....... *G01R 33/028* (2013.01); *G01R 33/0286* (2013.01); *G01R 33/038* (2013.01)

(58) Field of Classification Search
CPC . G01R 33/028; G01R 33/0286; G01R 33/038
See application file for complete search history.

(56) References Cited

U.S. PATENT DOCUMENTS

2013/0002244 A1* 1/2013 Quevy ............... G01R 33/0286
324/244

OTHER PUBLICATIONS

Emmerich et al., Magnetic Field Measurements with a Novel Surface Micromachined Magnetic-Field Sensor, IEEE Transactions on Electron Devices, vol. 47, issue 5, pp. 972-977, 2000.*
Domínguez-Nicolás et al., "Signal Conditioning System With a 4-20 mA Output for a Resonant Magnetic Field Sensor Based on MEMS Technology", Sensors Journal, IEEE, vol. 12, No. 5, pp. 935-942, May 2012.

* cited by examiner

*Primary Examiner* — Daniel Miller
(74) *Attorney, Agent, or Firm* — Muncy, Geissler, Olds & Lowe, P.C.

(57) ABSTRACT

Disclosed is a resonant magnetic field sensor, comprising a detector structure including a mass block and displacement detection electrodes; capacitance to voltage converter and amplifier to convert detection signals of the detection electrodes into voltage signals, as output signals of the magnetic field sensor; and a vibration driving circuit to provide the output signals to the mass block in the form of a current, to drive the mass block to vibrate. The vibration driving circuit may be a comparator.

7 Claims, 5 Drawing Sheets

RESONANT MAGNETIC FIELD SENSOR

FIELD OF THE INVENTION

The present invention relates to a resonant magnetic field sensor, especially to a resonant magnetic field sensor without the need of an external oscillator.

BACKGROUND OF THE INVENTION

The micro magnetic field sensor is an element widely used in, for example, smart phones, wearable devices and Internet of Things (IOT) devices. The micro magnetic field sensor may also be used in other fields of engineering, science, and industry. For providing a function of magnetic measurement on a modern application, the micro magnetic field sensor has to be highly integrated, have low power consumption and provide correct magnetic force/magnetic field measurement.

In various micro magnetic field sensors, the magnetic field sensor exploiting the Lorentz forces is practical. The reason is that this kind of micro magnetic field sensor can be manufactured in a standard CMOS process. In addition, the resonant magnetic field sensor provides relatively high sensitivity and its outputs may be magnified by an amplifier in response to its quality factor, or Q-factor, therefore provides stronger output signals and higher signal-to-noise ratios. As a result, most new-type micro magnetic field sensor structures exploit the principle of the Lorentz forces and operate under its resonance frequency.

A magnetic field sensor using the Lorentz forces generally comprises a mass block which is suspended in a structure or on a substrate via a spring. When a constant current is applied to the mass block, the current and magnetic forces existing in the earth magnetic field or generated by other magnetic objects generate the Lorentz forces, which move the mass block in a direction perpendicular to the current direction and the magnetic force direction. An electrode for detection forms generally in a comb or finger shape which is staggered with a comb or finger shape formed by an edge of the mass block and maintained at intervals. The space between them is equivalent to a capacitor. The electrode for detection can detect a change in capacitance due to a change in the relative position between the mass block and the electrode for detection caused by the movement of the mass block and generate a detection signal representing the change. The detection signal is converted into a voltage form as an output signal. The generated output signal represents a displacement direction and a displacement amount of the mass block under the influence of the magnetic force, therefore a value of the magnetic force can be calculated on this basis.

The operational principle of the resonant magnetic field sensor is basically the same as that of the magnetic field sensor exploiting the Lorentz forces. In addition, the resonant magnetic field sensor uses a driver circuit to supply a constant current signal to the mass block. The frequency of the current signal is equal to the mechanical resonance frequency of the mass block. The current thus drives the mass block to vibrate at its resonance frequency. When the mass block vibrates at its resonance frequency, the displacement direction and the amount of displacement of the mass block, caused by the Lorentz forces so generated, are detected and are used to calculate the magnetic field applied to the mass block. The intensity of signals generated by a resonant magnetic field sensor is stronger than that by a non-resonant magnetic field sensor.

In the conventional resonant magnetic field sensors, an external oscillator is required to drive the mass block of the micro magnetic field sensor to vibrate at its resonance frequency. In such conventional arts, an external oscillator is used to generate oscillation signals at a constant frequency, so to drive the mass block of the magnetic field sensor to vibrate and to lock the vibration frequency at its resonance frequency. For general introduction and descriptions of the application of such external oscillator and the detection of a magnetic field by having the mass block vibrate at its resonance frequency, the following article may be taken as reference: Dominguez-Nicolas: "Signal Conditioning System With a 4-20 mA Output for a Resonant Magnetic Field Sensor Based on MEMS Technology," Sensors Journal, IEEE, Vol. 12, No. 5, pp. 935-942, May 2012.

Although known resonant magnetic field sensors may drive the mass block of the magnetic field sensor to vibrate at its resonance frequency, the addition of the external oscillator does not only increase the cost and the volume of the magnetic field sensor but also bring difficulties to the calibration of the resonance structure. One main reason is that the instability of the process in the manufacture of the oscillator would alter the resonance frequency of its resonance structure. As a result, each oscillator provides its particular resonance frequency. Every magnetic field sensor using an additional oscillator needs to be calibrated before putting to use, in order to ensure its mass block may vibrate at its resonance frequency and the vibration is locked to such resonance frequency. In addition, the high Q-factor of micro-electromechanical (MEM) detectors also represents the frequency responsive bandwidth of the detector, used as an oscillator, is quite narrow. For example, if the resonant frequency of an MEM detector is 1 kHz and the Q value is 10,000, then its frequency responsive bandwidth is only 1000/10000=0.1 Hz. This characteristic makes the external oscillator need to perform such a high frequency-stability of hundreds of ppm levels. What's worse, the frequency stability of the driver signals also impacts its amplitude, thereby affecting the resolution of the resulting signals.

OBJECTIVES OF THE INVENTION

Therefore, it is necessary to provide a novel structure of the resonant magnetic field sensor, so to ensure stability of its resonance frequency.

It is also necessary to provide a novel structure of the resonant magnetic field sensor, so that its resonance structure may be locked to its resonance frequency.

It is also necessary to provide a resonant magnetic field sensor, which does not need an external oscillator.

SUMMARY OF THE INVENTION

The present invention provides a novel resonant magnetic field sensor that needs no external oscillator. According this invention, the resonant magnetic field sensor comprises: a detector structure, a converter circuit and a vibration driving circuit, wherein the detector structure comprises a mass block suspended in the detector structure; and two sets of displacement detection electrodes disposed on the detector structure, at both sides of the mass block along a first direction X in a plane where the mass block is arranged.

The converter circuit connects to the displacement detection electrodes of the detector structure, to convert detection results of the displacement detection electrodes into a voltage signal. The converter circuit may be a capacity to voltage converter and may include an amplifier connected to the rear stage of the capacitor to voltage converter for magnifying the voltage signal output by the capacitor to voltage converter and outputting the magnified signals to rear stage computing circuits, for calculating magnetic forces detected by the displacement detection electrodes. The vibration driving circuit is connected to the output of the amplifier, to provide the output of the amplifier to the mass block in the detector structure in a form of current, for driving the mass block to vibrate. Currents provided by the vibration driving circuit flow through the mass block in a second direction Y, which is perpendicular to the first direction X in the plane where the mass block is arranged. The vibration driving circuit may further provide an amplification function that magnifies the output signals of the amplifier.

In the preferred embodiments of the present invention, the vibration driving circuit may comprise a comparator circuit, which input is connected to an output of the amplifier, and a reference potential, for outputting a result of comparison between output signals of the amplifier and the reference potential, as vibration driving signal of the mass block. Outputs of the vibration driving circuit are supplied to the mass block of the detector structure, to drive the mass block to vibrate. The frequency of the vibration driving signal is equal to the resonance frequency of the mass block. Amplitude of the mass block increases with time and becomes stable after a short period of time. In the preferred embodiment of the present invention, the reference potential is ground potential.

These and other objectives and advantages of this invention will be clearly appreciated from the following detailed description by referring to the following drawings.

DETAILED DESCRIPTION OF THE INVENTION

In the followings several embodiments of this invention will used to illustrate the structure of the resonant magnetic field sensor of the present invention. It is appreciated that these embodiments are used to exemplify the structure and applications of the resonant magnetic field sensor of this invention. It is not intended to illustrate all possible embodiments of this invention. Scope of protection of the invention is defined by the attached claims, only.

Figure 1:
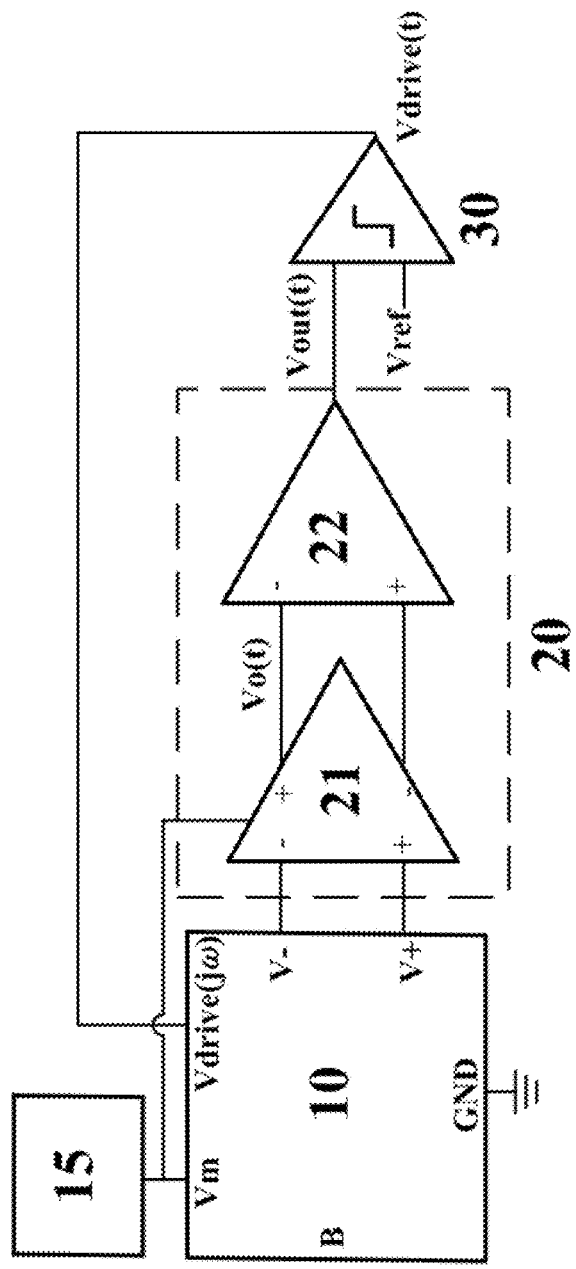
FIG. 1 shows the systematic diagram of one embodiment of the resonant magnetic field sensor of this invention.

FIG. 1 shows the systematic diagram of one embodiment of the resonant magnetic field sensor of this invention. As shown in this figure, the resonant magnetic field sensor of this embodiment includes a detector structure 10, a converter circuit 20 and a vibration driving circuit 30. The detector structure 10 may be any micro magnetic field sensor structure prepared by any suitable process. The detector structure 10 provides detection signals representing a magnetic force applied to the detector structure 10 and its direction. The converter circuit 20 includes a capacitor to voltage converter 21, for the detection signal into a voltage format, and an amplifier 22 to magnify the output detection signals of the capacitor to voltage converter 21. The vibration driving circuit 30 is used to drive a mass block in the detector structure 10 to vibrate and to lock the vibration frequency at the resonant frequency of the mass block.

Figure 2:
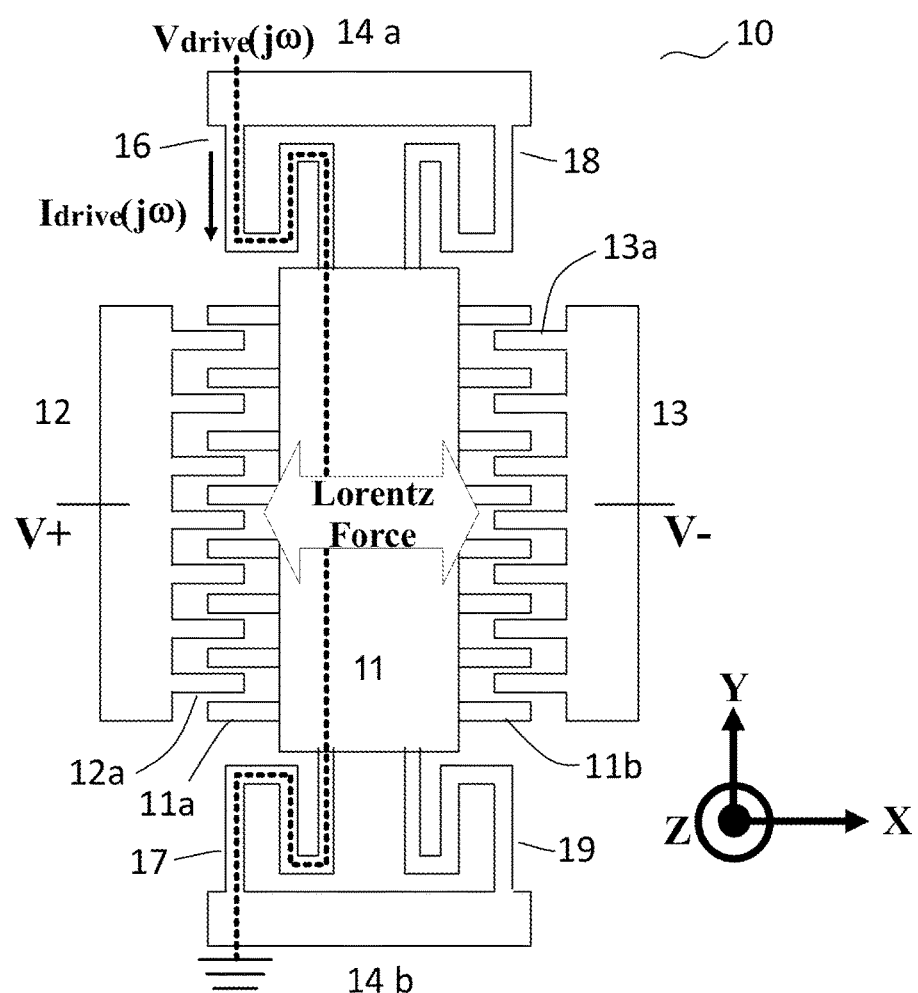
FIG. 2 shows the plan view of one detector structure applicable in the resonant magnetic field sensor of the present invention.

FIG. 2 shows the plan view of one detector structure applicable in the resonant magnetic field sensor of the present invention. As shown in this figure, the detector structure 10 has a mass block 11, suspended on the detector structure 10 by springs 16, 17, 18, 19. At the positions in the detector structure 10 where the springs 16, 17, 18, 19 are suspended, two electrodes 14a and 14b are provided.

The detector structure 10 further includes two sets of displacement detection electrodes 12 and 13, disposed in the detector structure 10, at its two sides along a first direction X in the plane of the mass block 11. In the embodiment shown in this figure, a plurality of finger-shaped or comb-shaped projections 11a, 11b is extended from the mass block 11, at its two sides along the X direction. On the other hand, the displacement detection electrodes 12 and 13 respectively extend finger-shaped or comb-shaped projections 12a, 13a from a side corresponding to finger-shaped projections 11a, 11b. The finger-shaped projections 12a, 13a of the displacement detection electrodes 12 and 13 respectively stagger with their corresponding finger-shaped projections 11a, 11b of the mass block 11 along a Y direction in the plane of the mass block 11 perpendicular to the X direction, such that two finger-shaped projections 12a and 13a of the displacement detection electrodes 12 and 13 respectively is interposed by a finger-shaped projection 11a, 11b of the mass block 11. Of course, such a staggered arrangement is only one preferred embodiment of the present invention. In the technical field of the MEM magnetic field sensor or resonant magnetic field sensor, various types of arrangement for finger-shaped electrodes of mass block and finger-shaped electrodes of the detection side have been developed and they respectively have their pros and cons. These arrangements are also applicable in this invention. In addition, electrodes of the mass block and the displacement detection electrode are not necessarily finger-shaped or comb-shaped. Any type of detection that is able to detect displacement of the mass block in a direction and amounts of the displacement may be applied in the present invention. The shape and structure of the mass block 11 and the displacement detection electrode 12, 13 are not the focus of the present invention and belong to the scope of the conventional techniques. Details thereof are thus omitted.

The mass block 11 and the displacement detection electrodes 12, 13 must include an electrical conductive for detecting displacements of the mass block and direction of the displacements, under the influence of a magnetic force. Generally speaking, any mass block and displacement detection electrodes that contain conductive and prepared using the MEM technology may be used in the present invention. However, in the preferred embodiments of the present invention, the displacement of the mass block 11 and the detection electrodes 12 and 13 are made from the standard CMOS process. In such embodiments, the mass block 11 and the displacement detection electrodes 12 and 13 will include one or more metal layers and a dielectric layer covering a metal layer or between two metal layers. In addition, the suspension structure of the mass block 11, the spring 16, 17 and the electrodes 14a and 14b are also prepared using the standard CMOS process. As the standard CMOS process is known in the technical field, details of the preparation are thus omitted.

In this embodiment of the present embodiment, the vibration driving circuit 30 functions as current supply and is connected to the mass block 11 via electrodes 14a and 14b, to supply to the mass block 11 a current Idrive (jω) in the second direction Y. The second direction Y refers to here is the direction perpendicular to the first direction X in the plane of the mass block 11.

The converter circuit 20 is connected to outputs V– and V+ of the detector structure 10, i.e., the outputs of the displacement detection electrodes 12, 13, for converting detection signals output by the displacement detection electrodes 12, 13 into voltage signals, magnifying the voltage signals and outputting the magnified detection signals Vout. These signals are provided to a rear-stage calculation circuit (not shown), in order to calculate values of magnetic field detected by detector structure 10. The magnified output signals Vout are results of detection of the resonance magnetometer detection of the present invention. According to the principle of Lorentz force, the output signal Vout is proportional to the magnetic force applied to the mass block 11 in the Z direction.

Amplifier circuit 20 of the converter 22 may include a filter to filter out signal components representing displacement, and direction of such displacement, of the mass block under the influence of the Lorentz force, from the output signals of the capacitor to voltage converter 21. The filter may be a low pass filter, whose cutoff frequency may be greater than the resonance frequency of the structure, 5.3 kHz, and less than the sampling frequency of 500 kHz.

The vibration driving circuit 30 is one of the most important features of this invention. The vibration driving circuit 30 is connected to the output Vout of the converter circuit 20, so to provide output signals of the converter circuit 20 to the mass block 11 inside the detector structure 10 in the form of current, for driving the mass block to vibrate. The vibration driving circuit 30 also magnifies output signals of the converter circuit 20.

In the preferred embodiment of the present invention, the vibration driving circuit 30 comprises a comparator circuit, with one input connected to output Vout of the converter circuit 20 and the other input connected to a reference potential Vref, such that it outputs results of comparison between output signals Vout of the converter circuit 20 and the reference voltage Vref, as the resonance driving signals Vdrive in the form of currents Idrive. The driving currents are provided to the mass block 11 via electrodes 14a and 14b of the mass block 11. Output of the vibration driving circuit 30 is connected to the driving signal input Vdrive/Idrive of detector structure 10, for driving the mass block 11 in the detector structure 10 to vibrate. The frequency of vibration of the mass block is equal to the resonance frequency of the mass block 11. After a short time, vibration of the mass block 11 will stabilize, such that it vibrates at its resonant frequency stably.

The resonant magnetic field sensor may further comprise a clock generator 15, connected to the detector 10, to provide frequency signal Vm that may be required in sampling.

According to physical principles in the known art, when a current is applied to the mass block 11 in the second direction Y (the Y direction or the negative Y direction), if the mass block 11 is subjected to a magnetic force towards the drawing (in the negative Z direction), the Lorentz force would force the mass block 11 to move in the first direction (the X direction or the negative X direction). When frequency of the alternating current is equal to the resonance frequency of the mass block 11, the mass block 11 will vibrate at its resonance frequency.

Although it is not intended to limit this invention by any theory, the inventors have found that, in the above-described circuit structure, the detection signals output by the detector structure 10 may be used to drive the mass block to vibrate, after they are converted into currents. After the mass block 11 starts to vibrate, the vibration frequency will soon reach the resonance frequency of the mass block 11. Amplitude of output signals representing results of comparison between the frequency signal and a reference potential Vref would be enlarged along with time to stabilize, whereby the mass block 11 will vibrate at its resonant frequency in a stable amplitude.

Figure 3:
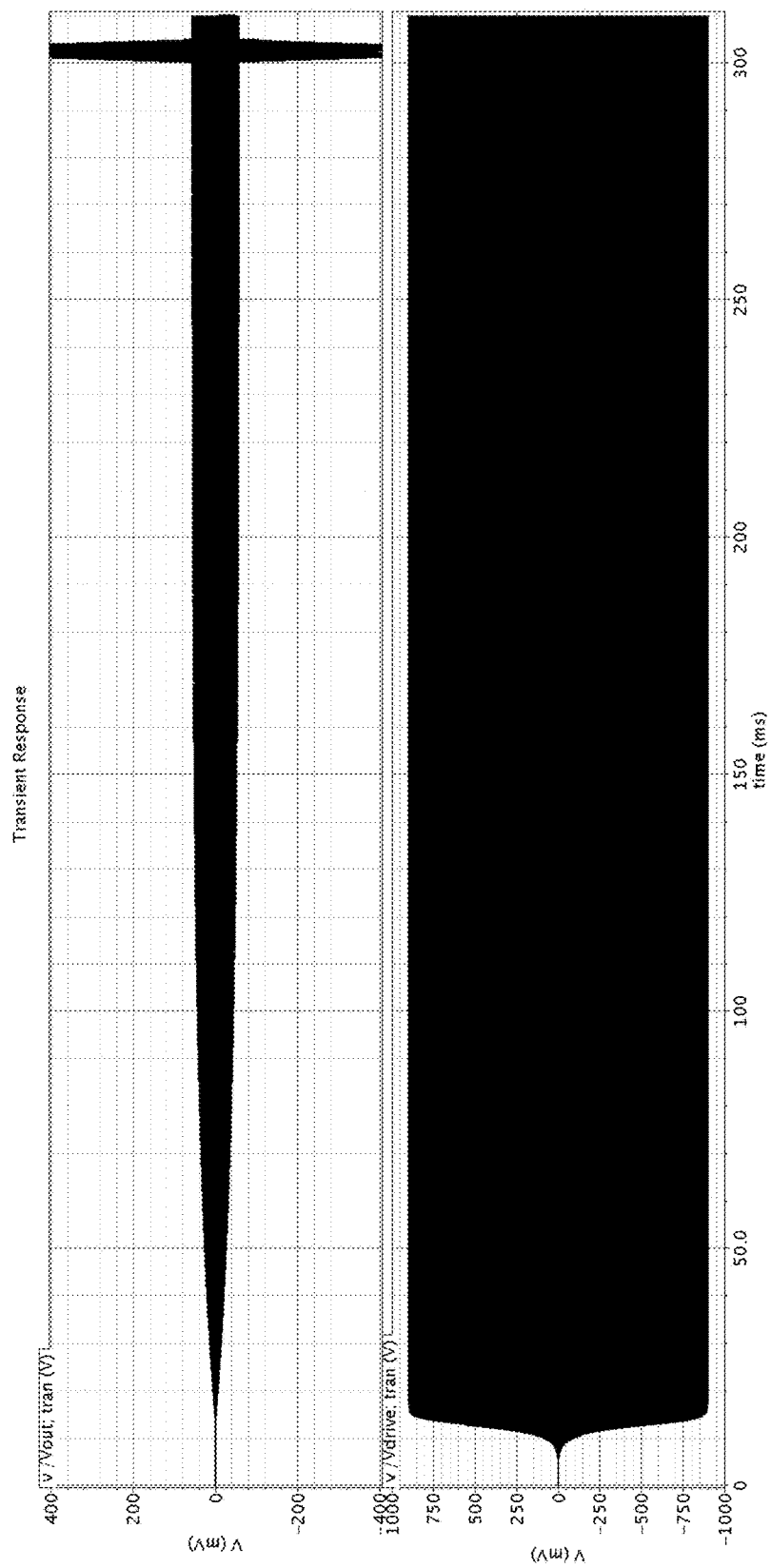
FIG. 3 shows results of transient state simulation to outputs Vout (upper) and Vdrive (lower) of the circuit in FIG. 1.

In the preferred embodiments of the invention, the reference potential Vref is the ground potential. However, the reference potential may be properly determined according to needs in the application. In the case where the reference potential Vref is the ground potential, as long as the output of the comparator 30 is not zero potential, the output in the form of a current will drive the mass block to vibrate and the vibration frequency of the mass block is its resonance frequency. Under the circuit design of the present invention, the output signal of the comparator 30 is gradually enlarged until it becomes stable. FIG. 3 shows results of transient state simulation to outputs Vout (upper) and Vdrive (lower) of the circuit in FIG. 1. In the simulation of FIG. 3, the reference voltage Vref is set to ground potential. The transient simulation analysis shows vibration of the mass block in the first 250 ms, after it starts to vibrate. It is shown that the vibration becomes stable after a short initial phase. In this figure, the amplitude of 114 mV and the frequency of Vout conform to the simulation conditions, i.e, 10 μT magnetic field and 5.3 kHz resonance frequency. Although the feedback drive signal Vdrive is a square wave, variation in capacitance of the detector is a sine wave signal. The MEM magnetic field sensor is a high-Q resonator, providing the function of a band-pass filter with a narrow frequency band.

Figure 4:
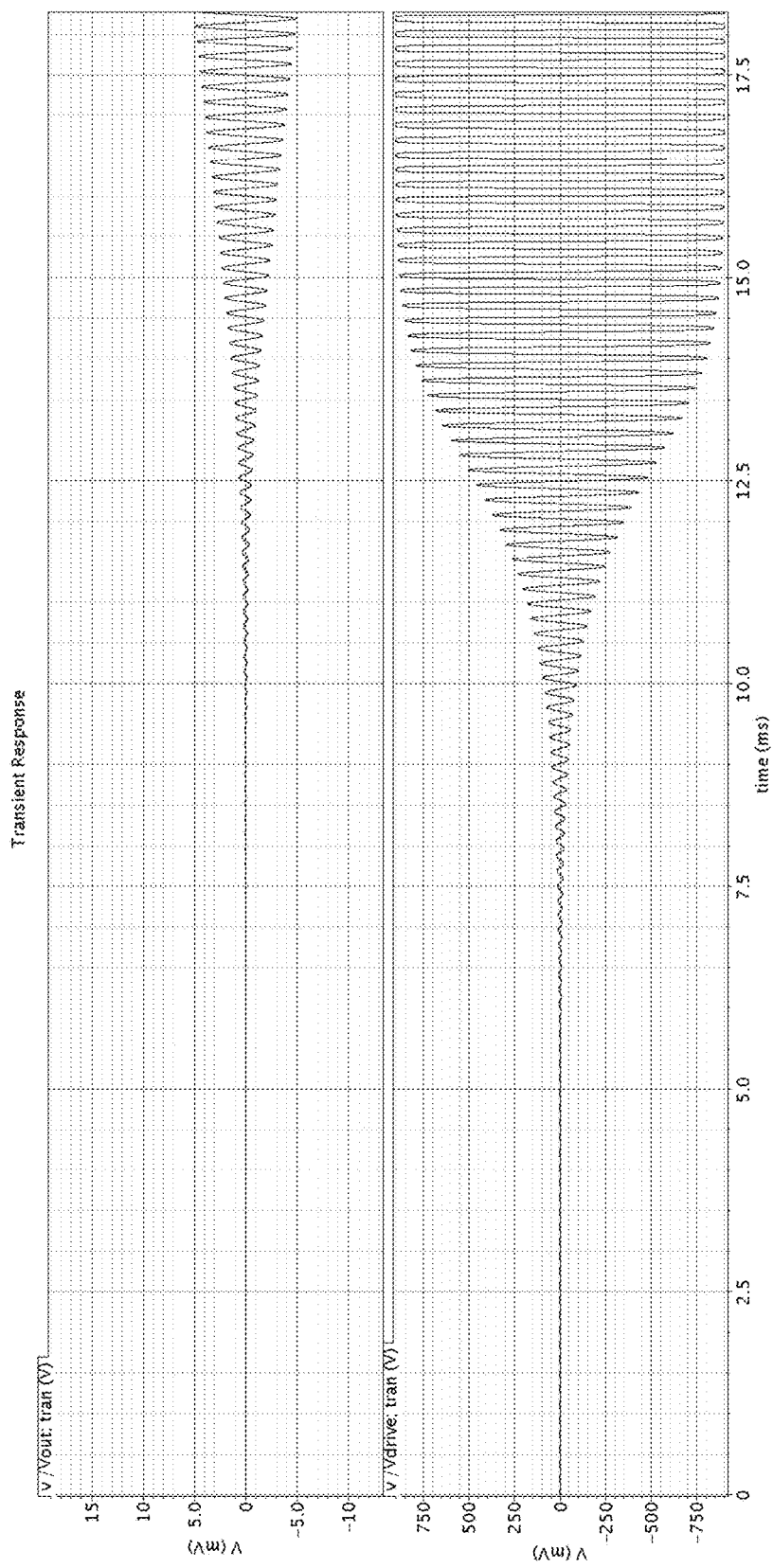
FIG. 4 shows an enlarged view of FIG. 3.
Figure 5:
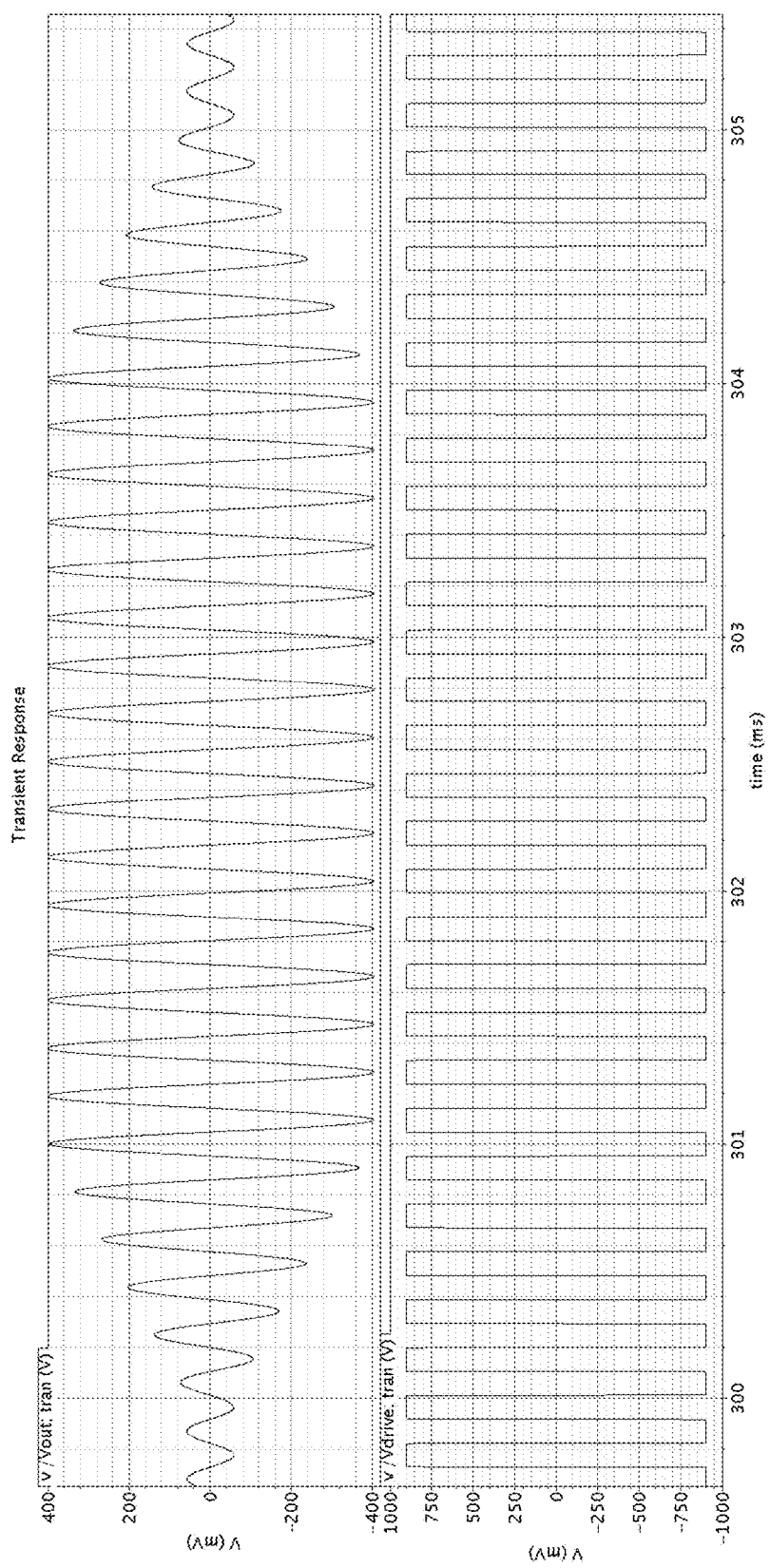
FIG. 5 shows another enlarged view of FIG. 3.

FIG. 4 shows the enlarged view of FIG. 3. This figure shows that the mass block 11 starts to vibrate, as long as outputs of the comparator 30 is not 0 potential. The amplitude of the vibration increases along with time, while frequency of the vibration is equal to the resonance frequency of the mass block 11. FIG. 5 is another enlarged view of FIG. 3. This figure shows the measured waveform when the magnetic field is increased from 10 μT to 70 μT, maintains for 3 ms and returns to 10 μT, all within 1 ms. The results show that in the present invention signal Vout provides good response, while the frequency Vdrive remains unchanged. The resonant magnetic field sensor of the present invention proves to be useful in driving the mass block to vibrate and in locking the vibration frequency at the resonant frequency of the mass block. The resonant magnetic field sensor can respond to variation of magnetic forces applied thereto immediately and show correct measurement results.

As described above, the present invention provides a resonant magnetic field sensor that needs no external oscillator. The invented resonant magnetic field sensor is able to lock the vibration frequency of its mass block at its oscillation frequency, without the need of an external oscillator. A novel and useful structure of resonant magnetic field sensor is thus provided.

What is claimed is:
1. A resonant magnetic field sensor, comprising:
   a detector structure, comprising a mass block suspended in the detector structure; and two sets of displacement detection electrodes disposed on the detector structure, at both sides of the mass block along a first direction X in a plane where the mass block is arranged;

a converter circuit, connected to the displacement detection electrodes of the detector structure, to convert detection results of the displacement detection electrodes into a voltage signal; and a vibration driving circuit, connected to output of the converter circuit, to provide output of the converter circuit to the mass block in the detector structure in a form of current, for driving the mass block to vibrate;

wherein currents provided by the vibration driving circuit flow through the mass block in a second direction Y, which is perpendicular to the first direction X in the plane where the mass block is arranged;

wherein the vibration driving circuit further comprise a comparator circuit, with one input connected to an output of the converter circuit and another input being a reference potential, for outputting a result of comparison between output signals of the converter circuit and the reference potential, as function as vibration driving signal of the mass block;

wherein the reference potential is ground potential.

2. The resonant magnetic field sensor according to claim 1, wherein the mass block is suspended on the detector structure with springs, wherein at the positions in the detector structure where the springs are suspended, two electrodes are provided and wherein currents flowing through the mass block in the second direction Y is supplied by the vibration driving circuit to the mass block via the electrodes.

3. The resonant magnetic field sensor according to claim 1, wherein a plurality of finger-shaped projections is extended from the mass block at its two sides along the X direction; a plurality of finger-shaped projections is extended from the displacement detection electrodes respectively from a side corresponding to the mass block; and the finger-shaped projections of the displacement detection electrodes respectively stagger with their corresponding finger-shaped projections of the mass block along the Y direction.

4. The resonant magnetic field sensor according to claim 1, wherein the mass block and the displacement detection electrodes include one or more metal layers and a dielectric layer covering a metal layer or between two metal layers.

5. The resonant magnetic field sensor according to claim 1, wherein the converter circuit further includes an amplifier to magnify the voltage signal.

6. The resonant magnetic field sensor according to claim 5, wherein the amplifier further includes a filter, to extract signal components representing a magnetic force from the output signals of the capacitor to voltage converter.

7. The resonant magnetic field sensor according to claim 6, wherein the filter is a low pass filter.

* * * * *